US006304458B1

(12) United States Patent
Mendolia

(10) Patent No.: US 6,304,458 B1
(45) Date of Patent: Oct. 16, 2001

(54) RF SHIELDED LCD ASSEMBLY AND PCB ASSEMBLY INCLUDING THE SAME

(75) Inventor: Samuel V. Mendolia, Forest, VA (US)

(73) Assignee: Ericsson Inc, Research Triangle Park, NC (US)

( * ) Notice: Subject to any disclaimer, the term of this patent is extended or adjusted under 35 U.S.C. 154(b) by 0 days.

(21) Appl. No.: 09/401,418

(22) Filed: Sep. 22, 1999

(51) Int. Cl.[7] .................................................. H04B 1/03
(52) U.S. Cl. .......................... 361/814; 361/800; 361/816; 361/818; 174/35 R; 379/433; 455/347; 455/344; 455/300; 455/301; 455/296
(58) Field of Search ................................. 362/248, 227; 361/818, 681–682; 379/433, 429–457; 349/149, 152; 455/347, 344, 300, 301, 296, 90; 312/223.4

(56) References Cited

U.S. PATENT DOCUMENTS

| | | | |
|---|---|---|---|
| 5,815,224 | * | 9/1998 | Hasegawa et al. ..................... 349/58 |
| 5,844,166 | | 12/1998 | Halttunen et al. .................. 174/35 R |
| 5,986,726 | * | 11/1999 | Murai ..................................... 349/59 |
| 6,149,062 | * | 11/2000 | Danielson et al. .............. 235/472.01 |

FOREIGN PATENT DOCUMENTS

| | | | |
|---|---|---|---|
| 2 297 868 A | 8/1996 | (GB) | ............................... H05K/9/00 |
| 06 347786 A | 12/1994 | (JP) | .............................. G02F/1/1335 |
| 10 153766 A | 6/1998 | (JP) | .............................. G02F/1/1333 |

* cited by examiner

Primary Examiner—Jeffrey Gaffin
Assistant Examiner—Thanh Y. Tran
(74) Attorney, Agent, or Firm—Myers Bigel Sibley & Sajovec

(57) ABSTRACT

A light guide/shield assembly for use with a circuit board includes an upstanding, electrically conductive shield wall adapted to be mounted on and electrically grounded to the circuit board. The shield wall defines an opening. A light guide member including a light transmissive guide body and an electrically conductive shield layer is mounted on the shield wall such that the shield layer overlies the opening. The light guide/shield assembly thereby defines an RF shielded chamber. The light guide/shield assembly may further include an LCD panel mounted on the light guide member. An RF shielded PCB assembly includes a circuit board including an electrical ground and the light guide/shield assembly mounted thereon.

50 Claims, 5 Drawing Sheets

RF SHIELDED LCD ASSEMBLY AND PCB ASSEMBLY INCLUDING THE SAME

FIELD OF THE INVENTION

The present invention relates to shielding and, more particularly, to devices for shielding electronic components and/or circuitry within electronic devices.

BACKGROUND OF THE INVENTION

With the advent of smaller and smaller cellular telephones, it has become increasingly necessary to provide means for shielding the user and various electrical components of the telephone from radio-frequency (RF) emissions from other components of the telephone and/or from the environment. Electrically conductive shield cans may be mounted on a printed circuit board (PCB) and shaped to surround the components which are to be protected from RF noise or, more commonly, to suppress RF noise from the components contained in the shield cans. Shield cans according to the prior art may suffer from a number of drawbacks. The shield cans may be costly to install. Typically, shield cans are manually soldered, a labor intensive process, or mounted on a PCB during the surface mount assembly (SMA) process.

A liquid crystal display (LCD) assembly may be mechanically fastened to the inside of a front cover of a telephone or attached to one or more edges of a PCB. A light guide and associated fastening means often require a large amount of space on the PCB. The assembly process for mounting the light guide and the LCD on the PCB may be costly and labor intensive as well.

The LCD electrical connections to the PCB may be made using elastomer or spring connectors. This arrangement may be unreliable. Elastomer connectors may be improperly installed, resulting in failed electrical connections or shorting of adjacent pads on the PCB. The elastomer connectors may leave the LCD pads on the PCB vulnerable to contamination, particularly when the LCD-elastomer interface is subjected to temperature and humidity stresses over time.

If repairs of the PCB are required, the entire shield can often must be removed. This often requires expensive shield can removal equipment, fixtures and trained technicians. Typically, the PCB and surrounding components are placed under additional heat stress during both the removal and replacement of the shield can. There is also risk of flux and solder contamination of critical areas on the PCB such as LCD, SIM, or battery pads. If the board is not successfully repaired or if components reflow and shift during the re-application of the shield can, the process typically must be repeated. Snap-on shield cans are known, but are typically expensive and add additional labor to the assembly process.

SUMMARY OF THE INVENTION

The present invention is directed to a light guide/shield assembly for use with a PCB. The light guide/shield assembly includes an upstanding, electrically conductive shield wall adapted to be mounted on and electrically grounded to the circuit board. The shield wall defines an opening. A light guide member including a light transmissive guide body and an electrically conductive shield layer is mounted on the shield wall such that the shield layer overlies the opening. The light guide/shield assembly thereby defines an RF shielded chamber.

The light guide/shield assembly may include an LCD panel mounted on the light guide member. The LCD panel may be removably secured to the light guide member.

Preferably, the shield wall comprises a substantially continuous ring and the shield layer covers the substantial entirety of the opening. The light guide member may be removably mounted on the shield wall.

The light guide/shield assembly may include an integral connector assembly. Preferably, the connector assembly includes a first electrical connector secured to the shield wall and a second electrical connector secured to the light guide member, the second connector adapted to engage the first connector. Further, the first connector may be adapted to engage a connector pad of the circuit board and the second connector may be adapted to engage a connector pad of an LCD panel.

According to a further aspect of the present invention, an RF shielded PCB assembly includes a circuit board including an electrical ground and a light guide/shield assembly as described above mounted thereon. An LCD panel may be mounted on the light guide member of the light guide/shield assembly. An RF emissive component and/or an RF sensitive component may be disposed in the RF shielded chamber. The RF shielded PCB assembly may include a light source, the light source and the light guide member being relatively arranged such that light from the light source is transmitted by the light guide member to the LCD.

According to a further aspect of the present invention, a wireless communications device includes an RF shielded PCB assembly as described above.

Objects of the present invention will be appreciated by those of ordinary skill in the art from a reading of the Figures and the detailed description of the preferred embodiments which follow, such description being merely illustrative of the present invention.

DETAILED DESCRIPTION OF PREFERRED EMBODIMENTS

Figure 1:
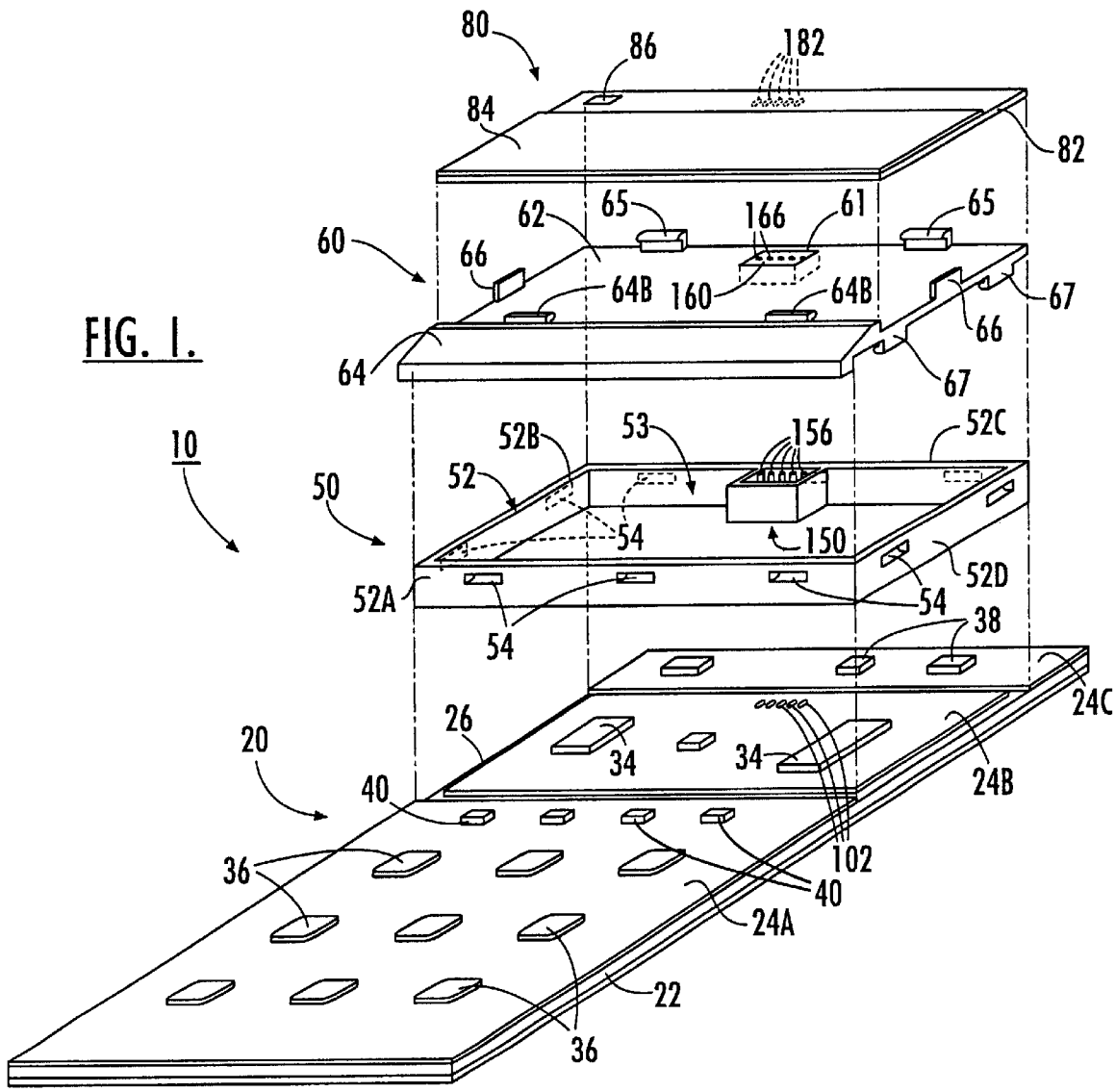
FIG. 1 is an exploded, front perspective view of an RF shielded PCB assembly according to the present invention.
Figure 2:
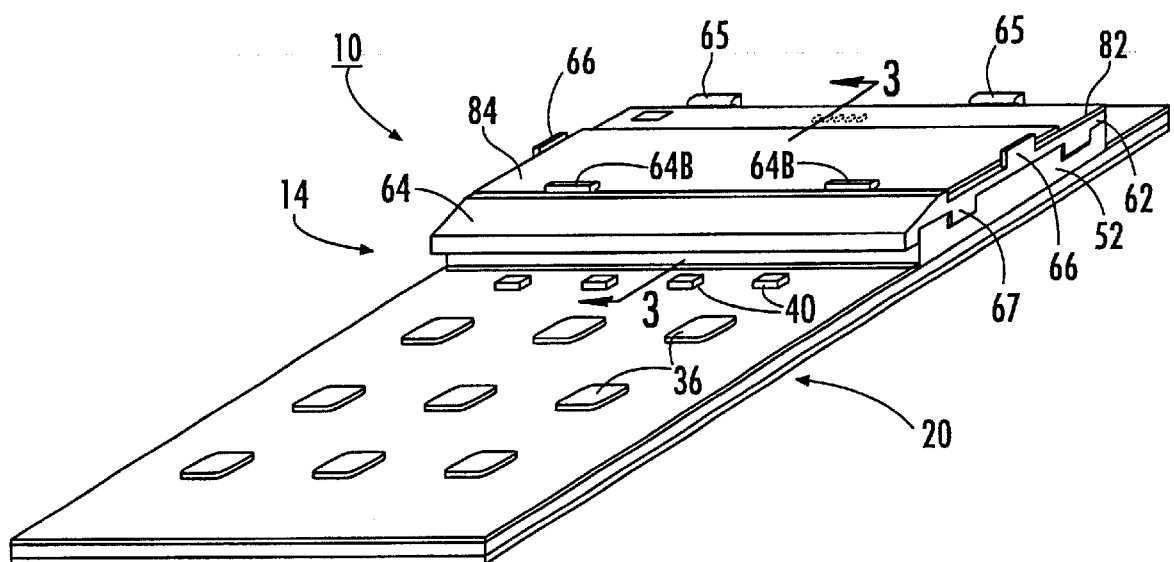
FIG. 2 is a front perspective view of the PCB assembly of FIG. 1.
Figure 3:
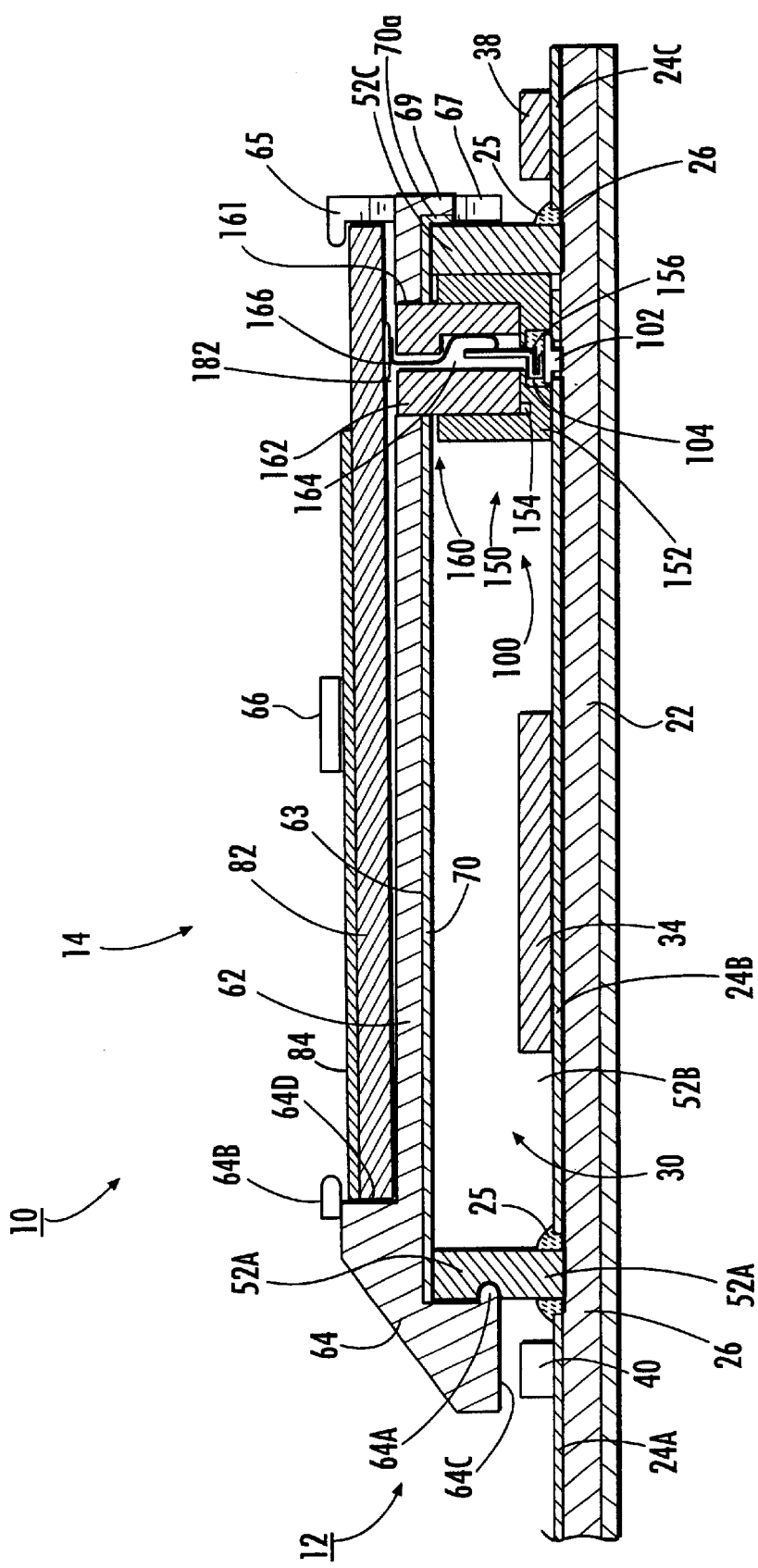
FIG. 3 is an enlarged cross-sectional view of the PCB assembly of FIG. 1 taken along the line 3—3 of FIG. 2.
Figure 4:
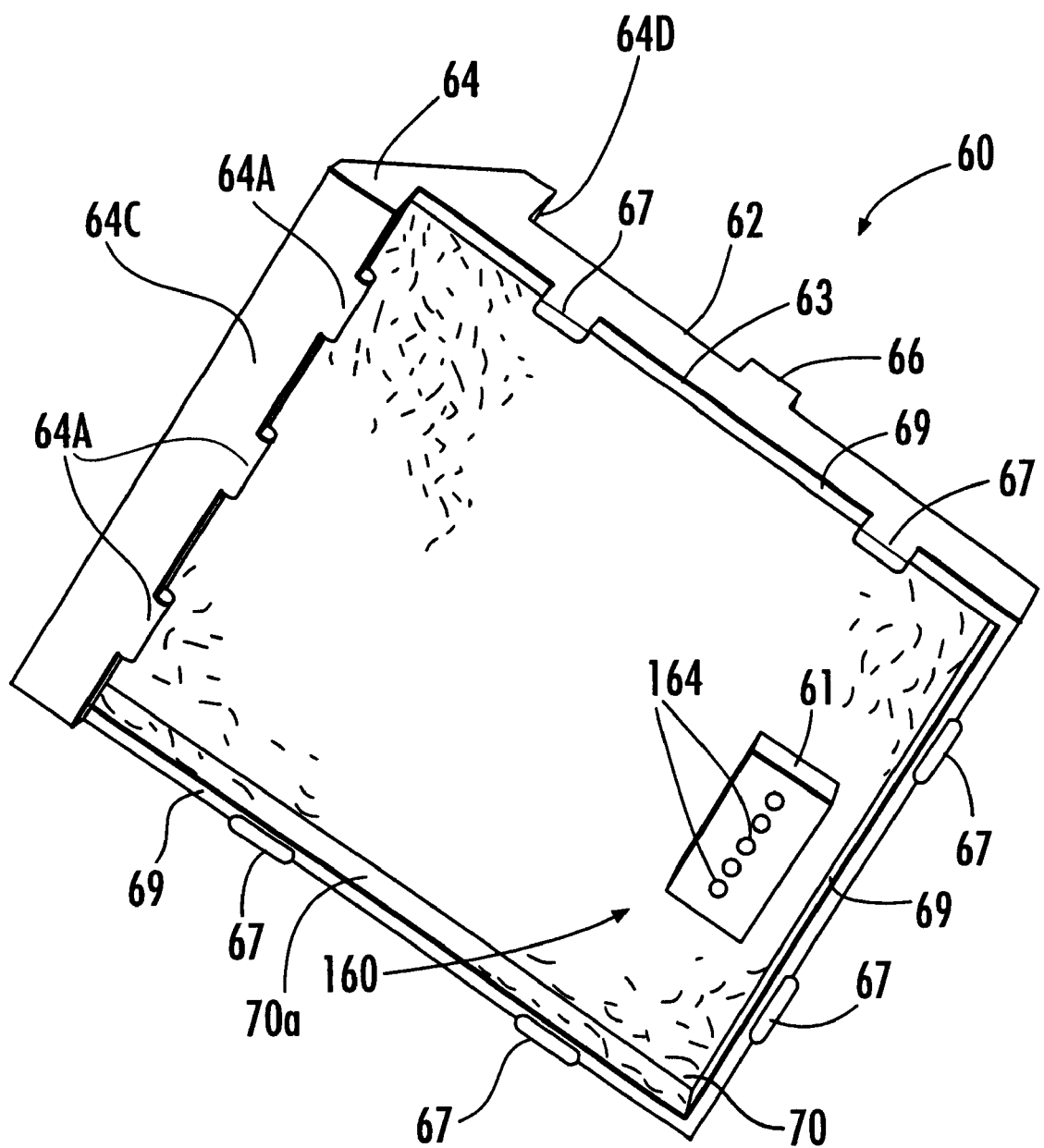
FIG. 4 is a bottom perspective view of a light guide member of the PCB assembly of FIG. 1.
Figure 5:
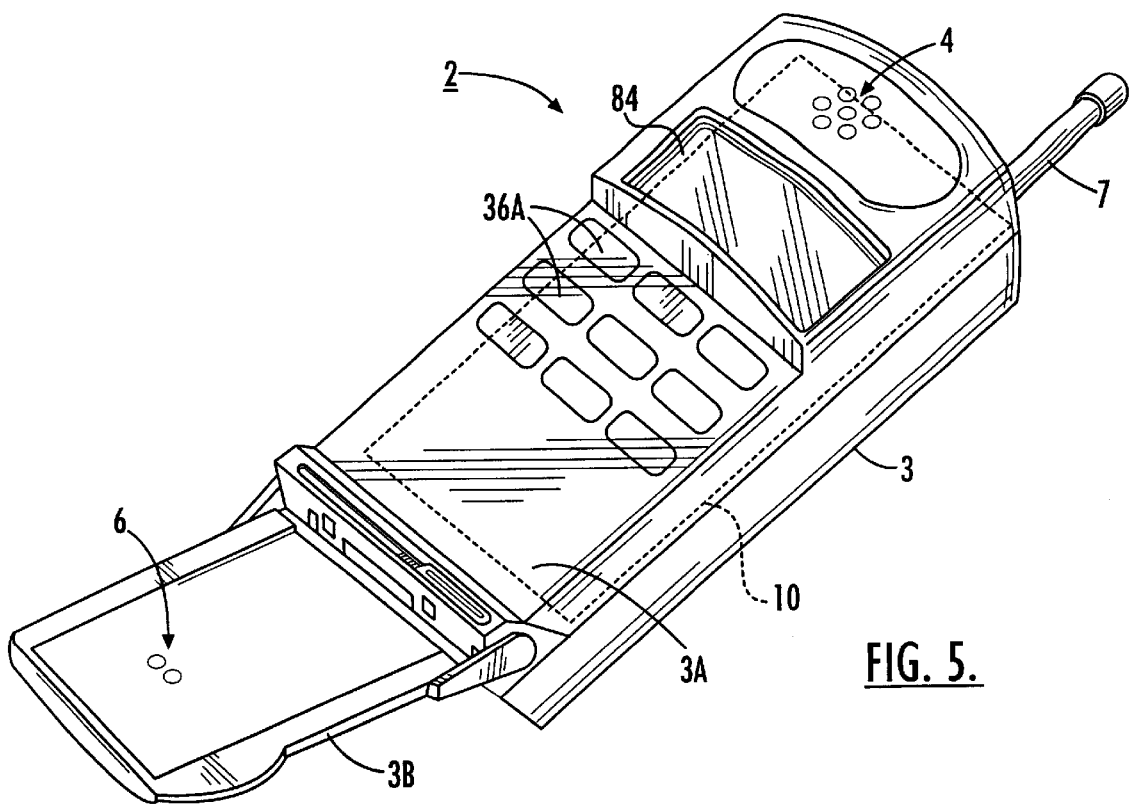
FIG. 5 is a perspective view of a radiotelephone including the PCB assembly of FIG. 1.

With reference to FIGS. 1–3, an RF shielded PCB assembly 10 according to the present invention is shown therein. A light guide member 60 forming a part of the PCB assembly 10 is shown in further detail in FIG. 4. A radiotelephone 2 capable of transmitting and receiving radio frequency signals and including the PCB assembly 10 is shown in FIG. 5. The present invention may also be used with wireless communications devices which only transmit or receive radio frequency signals. Such devices may include conventional AM/FM radios, personal digital assistants (PDAs), pagers or any receiver utilizing an antenna.

Devices which only transmit signals may include remote data input devices.

The PCB assembly 10 includes generally a PCB 20, a shield wall member 50, a light guide member 60, a LCD panel 80 and a connector assembly 100. The shield wall member 50 and the light guide member 60 together form a light guide/shield assembly 12 (see FIG. 3) as discussed below. The light guide/shield assembly 12 and the LCD panel together form an LCD assembly 14 (see FIG. 2), also as discussed below.

The PCB 20 is of generally conventional construction. The PCB 20 has an electrically conductive board or ground plane 22 and electrically insulative solder masks 24A, 24B, 24C on the front face thereof. A portion 26 of the PCB board 22 is exposed through the solder mask and surrounds the solder mask portion 24B.

Button pads 36 and LCD connection pads 102 are exposed through the solder masks 24A and 24B. Light Emitting Diodes (LEDs) 40 and various electrical components and circuitry 34 and 38 are mounted on the PCB 20. The components 34 may include, for example, RF reception and/or transmission circuitry.

The shield wall member 50 includes a shield wall ring 52 including a front wall 52A, a rear wall 52C and opposed side walls 52B and 52D. Detents 54 are formed in the outer faces of the walls 52A, 52B, 52C, 52D. The shield wall ring 52 defines an upper opening 53. A male connector member 150 forming a part of the connector assembly 100 is secured to the interior face of the rear wall 52C by any suitable means such as adhesive or a mechanical connection such as a snap-fit.

The ring 52 includes an electrically conductive material. Suitable materials include aluminum, tin or low carbon steel. Preferably, the ring 52 is formed substantially entirely of the electrically conductive material. However, the ring 52 may be formed of a non-conductive material (not shown) with the electrically conductive material coating, plating or embedded in the non-conductive material. The ring 52 is preferably cast. However, the ring 52 may be formed by other suitable processes such as molding, stamping, or assembly of separately formed walls or sections. Each of the walls 52A, 52B, 52C, 52D preferably has a thickness of between about 0.85 mm and 1.15 mm.

The shield wall member 50 is mounted on the PCB 20 such that the lower edges of the walls 52A, 52B, 52C, 52D directly engage the exposed portion 26 of the board 22. In this manner, the shield wall ring 52 is electrically grounded, the board 22 serving as the ground plane. The shield wall ring 52 is secured to the portion 26 by solder 25 (see FIG. 3). Preferably, the shield wall member 50 is mounted on the PCB by applying the solder 25, and thereafter flowing the solder 25, along with the other solder connections of the PCB 20, in an oven.

The light guide member 60 includes a light guide body 62. A front flange 64 extends along the front edge of the guide body 62. Side and rear flanges 69 (see FIGS. 3 and 4) extend downwardly from the side and rear edges of the guide body 62. A hole 61 is formed through the guide body 62. A female connector 160 forming a part of the connector assembly 100 is secured in the hole 61.

The flange 64 has upper clips 64B, lower clips 64A (see FIG. 4), a lower face 64C and a rear face 64D. Upper clips 65 extend from the rear edge of the guide body 62. Guide tabs 66 extend up from the sides of the guide body 62. The clips 64B, 65 and the guide tabs 66 cooperate to register and hold the LCD panel 80 as discussed below.

Clips 67 project downwardly from the sides and rear edges of the guide body 62. The clips 67 and 64A cooperate to secure the light guide member 60 to the shield wall member 50, and thereby to the PCB 20. More particularly, the clips 67 engage the detents 54 of the walls 52B, 52C, 52D. Similarly, the clips 64A engage the detents 54 of the front wall 52A. Also, the inner dimensions of the flanges 64, 69 are substantially the same or slightly less than the outer dimensions of the shield wall ring 52 so that the flanges 64, 69 provide a releasable friction fit with the ring 52. As will be appreciated from the foregoing description, the light guide member 60 may be removably secured to the shield wall ring 52 simply by pushing the light guide member 60 down onto the shield wall ring 52. When so mounted, the light guide member 60 will completely cover the opening 53 defined by the shield wall ring 52 and the flanges 64, 69 will engage upper, outer, side portions of the walls 52A, 52B, 52C, 52D. Preferably, the light guide member 60 is clipped onto the shield wall member 50 after completion of the mounting of the shield wall member 50 onto the PCB 20.

The light guide member 60 is preferably formed of acrylic or another suitable light conductive clear plastic material. The light guide member 60 is preferably molded, but may be formed by any suitable process. Preferably, the light guide member 60, the clips 64A, 64B, 65, 67 and the guides 66 are integrally molded. The connector member 160 may be bonded, sonically welded or otherwise secured in the hole 61. Moreover, a body 162 (see FIG. 3) of the connector member 160 may be integrally formed (not shown) with the light guide member 60.

The guide body 62 has a bottom surface 63. An electrically conductive layer 70 is secured to the bottom surface 63. An electrically conductive coating 70A is secured to the inner surfaces of the flanges 64, 69 and is contiguous with the layer 70. Each of the layers 70, 70A is preferably a coating of nickel. The layers 70, 70A may also be copper with a nickel overcoat. Suitable methods for applying the layers 70, 70A include electroplating, vacuum depositing, ion implanting and spraying. The thickness of the layer 70 should be at least the skin depth of the frequency to be shielded for the chosen material of the layer 70. Preferably, the layers 70, 70A have a thickness of between about 3 and 5 microns. The layers 70, 70A may be formed of a light reflective material to enhance transmission of light from the LEDs 40 to the LCD panel 80 (as discussed in more detail below).

The LCD panel 80 is of substantially conventional construction. The LCD panel 80 includes a glass panel 82, a display portion 84, a logic chip 86 on the glass panel 82, and electrical connector pads 182 on a lower surface of the glass panel 82. The LCD panel 80 is removably secured to the light guide member 60 by inserting the LCD panel 80 beneath the clips 64B, 65 and between the tabs 66. If desired, additional securing means such as adhesive or supplemental clips may be used to secure the LCD panel to the light guide member. The LCD panel 80 is preferably mounted on the light guide member 60 prior to mounting the light guide member 60 on the shield wall member 50 and the PCB 20.

In use, upwardly directed light from the LEDs 40 is received by the light guide member 60 through the lower face 64C, transmitted through the flange 64 and the guide body 62, and ultimately emitted upwardly to illuminate at least the display portion 84 of the LCD panel 80.

As best seen in FIG. 3, the connector member 150 of the connector assembly 100 includes a body 152 defining a receiving cavity 154, and a contact pin 156 for each pad 102.

Each pin 156 is secured to a respective connector pad 102 by solder 104. The solder 104 is preferably applied at the same time as the solder 25. The strength of the connection between the pins 156 and the pads 102 is assured by the securement of the body 152 to the rear shield wall 52C, which is in turn secured to the PCB 20 as well as the remaining walls 52A, 52B, 52D which are likewise secured to the PCB 20.

As noted above, the body 162 of the connector member 160 is secured to the light guide member 60 in the hole 61. The body 162 defines a plurality of cavities 164, each of which houses a respective contact 166. Each contact 166 releasably engages a respective one of the pins 156 and is pressure fitted to a respective pad 182.

With continued reference to FIG. 3, when the light guide member 60 is mounted on the shield wall member 50, the electrically conductive coating 70 engages the upper faces of the shield walls 52A, 52B, 52C, 52D and the electrically conductive coating 70A engages the outer, side faces of the shield walls 52A, 52B, 52C, 52D. In this way, the electrically conductive coating is electrically grounded to the board 22 via the shield wall ring 52. The light guide member 60 and the shield wall member 50 thereby combine to form an RF shielded chamber 30.

From the foregoing description, it will be appreciated by those of ordinary skill in the art that the PCB assembly according to the present invention provides a number of significant benefits and advantages. The LCD panel 80 and light guide member 60 are easily removable to facilitate repair of the components 34, the light guide panel 80, and/or the light guide member 60. The assembly process is substantially simplified and requires no special skills or equipment. The amount of PCB real estate required by the light guide is reduced. The mechanical connection of the light guide member 60 to the PCB 20 is robust and reliable because the light guide member 60 is attached around the perimeter of the shield wall ring 52, which is in turn securely soldered to the PCB 20. The electrical connection of the LCD panel 80 to the pads 102 is protected from contamination because it is a soldered connection. The overall tolerance stack up is reduced. Moreover, because the connection is a soldered connection, the connection is secure and reliable. Generally, component and labor costs associated with assembly and repair of the PCB assembly 10 are significantly reduced.

It will be appreciated by those of skill in the art that the PCB assembly 10 as described herein may be modified as appropriate. For example, the LCD connector assembly 100 and the connection pads 102, 182 may be repositioned outside of the shield wall ring 52, depending on the nature of the circuitry being shielded. The ground pin of the LCD connector 160 may be connected to the shield wall ring 52 to eliminate a connection pad on the PCB 20. The light guide member 60 may be shaped and arranged differently from that illustrated in the drawings as desired. Alternative means may be provided for mounting the LCD panel 80 to the light guide member 60. Additional components such as a buzzer or a speaker may be mounted on the light guide member 60.

With reference to FIG. 5, a portable cellular radiotelephone 2 incorporating the PCB assembly 10 is shown therein. The radiotelephone 2 includes a body 3 housing the PCB assembly 10 such that the display portion 84 is visible to the user. The radiotelephone 2 has buttons 36A on a front face 3A of the body 3 which engage the button pads 36. In conventional manner, the radiotelephone 2 also includes an antenna 7, a flip portion 3B, a microphone 6 on the flip portion 3B, and a speaker 4. Suitable constructions of the radiotelephone 2 and the connections between and arrangement of the components of the radiotelephone 2 and the PCB assembly 10 will be apparent to those of skill in the art upon reading the description herein.

Figure 6:
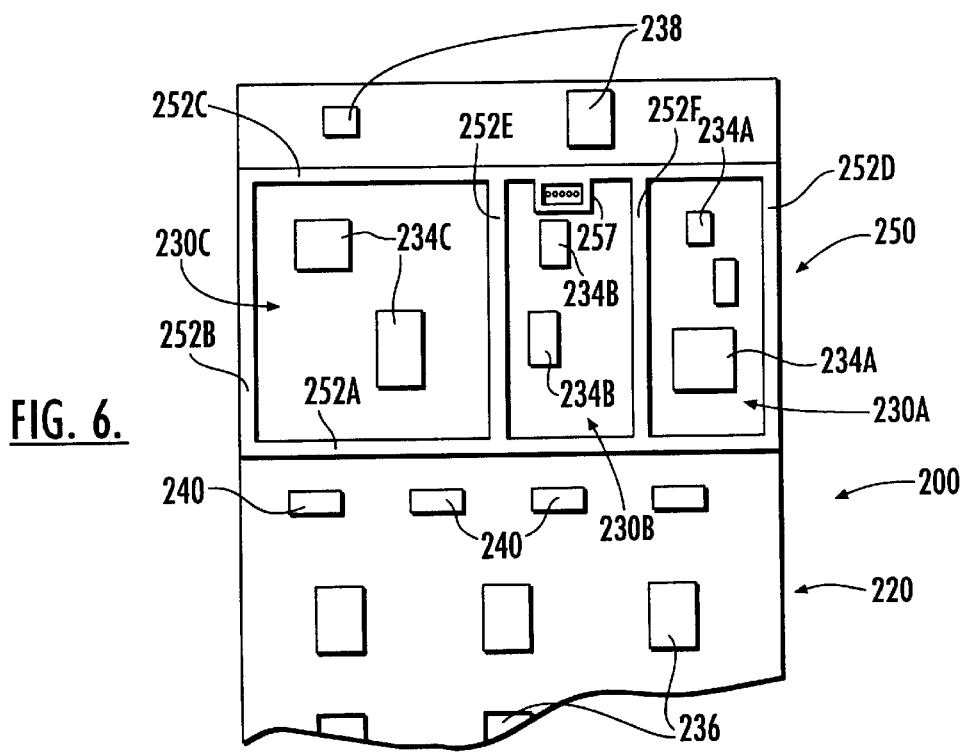
FIG. 6 is a fragmentary, top plan view of an RF shielded PCB assembly according to a second embodiment of the present invention.

With reference to FIG. 6, a portion of a PCB assembly 200 according to a second embodiment of the present invention is shown therein. The PCB assembly 200 includes elements 220, 236, 238 and 240 corresponding to elements 20, 36, 38 and 40 of the PCB assembly 10. The PCB assembly 200 includes a shield wall member 250. The shield wall member 250 has shield walls 252A, 252B, 252C, and 252D corresponding to the shield walls 52A, 52B, 52C, and 52D of the shield wall member 50, as well as a connector member 257 corresponding to the connector member 150. The PCB assembly 200 otherwise corresponds to the PCB assembly 10 except as follows. The shield wall member 250 has partition shield walls 252E and 252F defining subchambers 230A, 230B and 230C. The subchambers 230A, 230B, 230C house (and the partition walls 252E and 252F separate) the electrical components 234A, 234B and 234C. The partition walls 252E and 252F may be provided as additional structural support for relatively large LCD panels. Alternatively or additionally, the partition walls 252E and 252F may serve to shield respective components from each other. For example, the components 234A may be RF reception circuitry and the components 234B may be RF transmission circuitry.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A light guide/shield assembly for use with a circuit board, said light guide/shield assembly comprising:
    a) an upstanding, electrically conductive shield wall adapted to be mounted on and electrically grounded to the circuit board, said shield wall defining an opening; and
    b) a light guide member including a light transmissive guide body and an electrically conductive shield layer, said light guide member mounted on said shield wall such that said shield layer overlies said opening, whereby said light guide/shield assembly defines an RF shielded chamber.

2. The light guide/shield assembly of claim 1 including an LCD panel mounted on said light guide member.

3. The light guide/shield assembly of claim 2 wherein said LCD panel is removably secured to said light guide member.

4. The light guide/shield assembly of claim 2 wherein said LCD panel is mounted on said guide body and said light guide member is adapted to transmit light from a light source positioned adjacent an end of said light guide member to said LCD panel.

5. The light guide/shield assembly of claim 1 wherein said shield wall comprises a substantially continuous ring and said shield layer covers the substantial entirety of said opening.

6. The light guide/shield assembly of claim 1 wherein said light guide member is removably mounted on said shield wall.

7. The light guide/shield assembly of claim 6 wherein said light guide member is removably secured to said shield wall by integral clips.

8. The light guide/shield assembly of claim 1 including an integral electrical connector assembly.

9. The light guide/shield assembly of claim 8 wherein said connector assembly includes a first electrical connector secured to said shield wall and a second electrical connector secured to said light guide member, said second connector adapted to engage said first connector.

10. The light guide/shield assembly of claim 9 wherein said first connector is adapted to engage a connector pad of the circuit board and said second connector is adapted to engage a connector pad of an LCD panel.

11. The light guide/shield assembly of claim 1 wherein said shield wall includes an electrically conductive partition wall separating said RF shielded chamber into at least two subchambers.

12. The light guide/shield assembly of claim 1 wherein said shield layer is disposed on a lower surface of said light guide member.

13. The light guide/shield assembly of claim 1 wherein said shield layer is formed of a light reflective material.

14. The light guide/shield assembly of claim 1 wherein said shield layer engages said shield wall.

15. An RF shielded PCB assembly comprising:
    a) a circuit board including an electrical ground; and
    b) a light guide/shield assembly including:
        an upstanding, electrically conductive shield wall mounted on said circuit board and electrically grounded to said electrical ground, said shield wall defining an opening opposite said circuit board; and
        a light guide member including a light transmissive guide body and an electrically conductive shield layer, said light guide member mounted on said shield wall such that said shield layer overlies said opening, whereby said light guide/shield assembly defines an RF shielded chamber.

16. The RF shielded PCB assembly of claim 15 including an LCD panel mounted on said light guide member.

17. The RF shielded PCB assembly of claim 16 wherein said LCD panel is removably secured to said light guide member.

18. The RF shielded PCB assembly of claim 16 including a light source, wherein said LCD panel is mounted on said guide body and said light source and said light guide member are relatively arranged such that light from said light source is transmitted by said light guide member to said LCD.

19. The RF shielded PCB assembly of claim 15 including at least one of an RF emissive component and an RF sensitive component disposed in said RF shielded chamber.

20. The RF shielded PCB assembly of claim 15 wherein said shield wall comprises a substantially continuous ring and said shield layer covers the substantial entirety of said opening.

21. The RF shielded PCB assembly of claim 15 wherein said light guide member is removably mounted on said shield wall.

22. The RF shielded PCB assembly of claim 21 wherein said light guide member is removably secured to said shield wall by integral clips.

23. The RF shielded PCB assembly of claim 15 including an integral electrical connector assembly.

24. The RF shielded PCB assembly of claim 23 wherein said connector assembly includes a first electrical connector secured to said shield wall and a second electrical connector secured to said light guide member, said second connector releasably engaging said first connector.

25. The RF shielded PCB assembly of claim 24 wherein said first connector engages a connector pad of said circuit board and said second connector is adapted to engage a connector pad of an LCD panel.

26. The RF shielded PCB assembly of claim 15 wherein said shield wall includes an electrically conductive partition wall separating said RF shielded chamber into at least two subchambers.

27. The RF shielded PCB assembly of claim 15 wherein said shield layer is disposed on a lower surface of said light guide member.

28. The RF shielded PCB assembly of claim 15 wherein said shield layer is formed of a light reflective material.

29. The RF shielded PCB assembly of claim 15 wherein said shield layer engages said shield wall.

30. An RF shielded PCB assembly comprising:
    a) a circuit board including an electrical ground;
    b) a light guide/shield assembly comprising:
        an upstanding, electrically conductive shield wall mounted on said circuit board and electrically grounded to said electrical ground, said shield wall comprising a substantially continuous ring and defining an opening opposite said circuit board; and
        a light guide member including a light transmissive guide body and an electrically conductive shield layer disposed on a lower surface of said light guide member, said light guide member removably mounted on said shield wall such that said shield layer covers the substantial entirety of said opening and engages said shield wall, whereby said light guide/shield assembly defines an RF shielded chamber;
    c) an LCD panel mounted on said light guide member;
    d) at least one of an RF emissive component and an RF sensitive component disposed in said RF shielded chamber; and
    e) a light source mounted on said PCB, wherein said light source and said light guide member are relatively arranged such that light from said light source is transmitted by said light guide member to said LCD.

31. The RF shielded PCB assembly of claim 30 wherein said LCD panel is removably secured to said light guide member.

32. The RF shielded PCB assembly of claim 30 wherein said light guide member is removably secured to said shield wall by integral clips.

33. The RF shielded PCB assembly of claim 30 including an integral electrical connector assembly, said connector assembly including a first electrical connector secured to said shield wall and a second electrical connector secured to said light guide member, said second connector releasably engaging said first connector, and wherein said first connector engages a connector pad of said circuit board and said second connector engages a connector pad of said LCD panel.

34. The RF shielded PCB assembly of claim 30 wherein said shield wall includes an electrically conductive partition wall separating said RF shielded chamber into at least two subchambers.

35. The RF shielded PCB assembly of claim 30 wherein said shield layer is formed of a light reflective material.

36. A wireless communications device comprising:
a) a housing configured to enclose electronic components that receive and/or transmit wireless communications signals;
b) an RF shielded PCB assembly comprising:
a circuit board including an electrical ground; and
a light guide/shield assembly including:
an upstanding, electrically conductive shield wall mounted on said circuit board and electrically grounded to said electrical ground, said shield wall defining an opening opposite said circuit board; and
a light guide member including a light transmissive guide body and an electrically conductive shield layer, said light guide member mounted on said shield wall such that said shield layer overlies said opening, whereby said light guide/shield assembly defines an RF shielded chamber.

37. The wireless communications device of claim 36 including an LCD panel mounted on said light guide member.

38. The wireless communications device of claim 37 wherein said LCD panel is removably secured to said light guide member.

39. The wireless communications device of claim 37 including a light source, wherein said LCD panel is mounted on said guide body and said light source and said light guide member are relatively arranged such that light from said light source is transmitted by said light guide member to said LCD.

40. The wireless communications device of claim 36 including at least one of an RF emissive component and an RF sensitive component disposed in said RF shielded chamber.

41. The wireless communications device of claim 36 wherein said shield wall comprises a substantially continuous ring and said shield layer covers the substantial entirety of said opening.

42. The wireless communications device of claim 36 wherein said light guide member is removably mounted on said shield wall.

43. The wireless communications device of claim 42 wherein said light guide member is removably secured to said shield wall by integral clips.

44. The wireless communications device of claim 36 including an integral electrical connector assembly.

45. The wireless communications device of claim 44 wherein said connector assembly includes a first electrical connector secured to said shield wall and a second electrical connector secured to said light guide member, said second connector releasably engaging said first connector.

46. The wireless communications device of claim 45 wherein said first connector engages a connector pad of said circuit board and said second connector is adapted to engage a connector pad of an LCD panel.

47. The wireless communications device of claim 36 wherein said shield wall includes an electrically conductive partition wall separating said RF shielded chamber into at least two subchambers.

48. The wireless communications device of claim 36 wherein said shield layer is disposed on a lower surface of said light guide member.

49. The wireless communications device of claim 36 wherein said shield layer is formed of a light reflective material.

50. The wireless communications device of claim 36 wherein said shield layer engages said shield wall.

* * * * *